(12) United States Patent
Bedell et al.

(10) Patent No.: US 7,247,546 B2
(45) Date of Patent: Jul. 24, 2007

(54) METHOD OF FORMING STRAINED SILICON MATERIALS WITH IMPROVED THERMAL CONDUCTIVITY

(75) Inventors: Stephen W. Bedell, Wappingers Falls, NY (US); Huajie Chen, Danbury, CT (US); Keith Fogel, Hopewell Junction, NY (US); Ryan M. Mitchell, Wake Forest, NC (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 26 days.

(21) Appl. No.: 10/710,826

(22) Filed: Aug. 5, 2004

(65) Prior Publication Data

US 2006/0027808 A1    Feb. 9, 2006

(51) Int. Cl.
*H01L 21/20* (2006.01)
*H01L 21/36* (2006.01)
*H01L 31/117* (2006.01)

(52) U.S. Cl. ......................... 438/478; 438/479; 257/616
(58) Field of Classification Search .................. 438/478, 438/616, 479; 257/616
See application file for complete search history.

(56) References Cited

U.S. PATENT DOCUMENTS

| | | | | |
|---|---|---|---|---|
| 5,665,631 A | * | 9/1997 | Lee et al. | 438/459 |
| 6,043,517 A | * | 3/2000 | Presting et al. | 257/184 |
| 2002/0168864 A1 | * | 11/2002 | Cheng et al. | 438/725 |
| 2004/0004271 A1 | | 1/2004 | Fukuda et al. | |
| 2004/0140531 A1 | * | 7/2004 | Werner et al. | 257/616 |

OTHER PUBLICATIONS

Churchill et al. "Optical etalon effects and electronic structure in silicon-germanium 4 monolayer: 4 monolayer strained layer superlattices", Semicond. Sci. Technol. 6 (1991) 18-26.*
Wang et al. (SiGe band engineering for MOS, CMOS and quantum effect devices, Journal of Materials Science: Materials in Electronics 6 (1995) 311-324).*

* cited by examiner

*Primary Examiner*—Carl Whitehead, Jr.
*Assistant Examiner*—Heather Doty
(74) *Attorney, Agent, or Firm*—Yuanmin Cai

(57) ABSTRACT

A method is disclosed for forming a strained Si layer on SiGe, where the SiGe layer has improved thermal conductivity. A first layer of Si or Ge is deposited on a substrate in a first depositing step; a second layer of the other element is deposited on the first layer in a second depositing step; and the first and second depositing steps are repeated so as to form a combined SiGe layer having a plurality of Si layers and a plurality of Ge layers. The respective thicknesses of the Si layers and Ge layers are in accordance with a desired composition ratio of the combined SiGe layer (so that a 1:1 ratio typically is realized with Si and Ge layers each about 10 Å thick). The combined SiGe layer is characterized as a digital alloy of Si and Ge having a thermal conductivity greater than that of a random alloy of Si and Ge. This method may further include the step of depositing a Si layer on the combined SiGe layer; the combined SiGe layer is characterized as a relaxed SiGe layer, and the Si layer is a strained Si layer. For still greater thermal conductivity in the SiGe layer, the first layer and second layer may be deposited so that each layer consists essentially of a single isotope.

17 Claims, 2 Drawing Sheets

METHOD OF FORMING STRAINED SILICON MATERIALS WITH IMPROVED THERMAL CONDUCTIVITY

BACKGROUND OF INVENTION

This invention relates to the fabrication of electronic devices, and more particularly to processes for forming strained Si and SiGe alloy films where the SiGe alloy has improved thermal conductivity.

Silicon layers that possess tensile strain are of interest for use in high-performance CMOS devices. Improved charge carrier mobilities in strained Si layers permit enhanced FET performance (higher on-state current) without the need for geometric scaling in the device. A strained Si layer is typically formed by growing a Si layer on a relaxed silicon-germanium (SiGe) layer. Depending on the device application, the SiGe layer may be grown either on a bulk Si substrate or on top of a silicon-on-insulator (SOI) wafer.

The strained Si on a relaxed SiGe layer may be viewed as a Si/SiGe bilayer structure.

Regardless of how the substrates are made, a substantial obstacle to device fabrication in a Si/SiGe bilayer structure is the poor thermal conductivity of the SiGe alloy material. This has been shown to degrade the DC characteristics of transistors fabricated on the bilayer structure. Since heat cannot be transported away as quickly as in the case of pure Si, the temperature in the channel region of the device increases, thereby degrading the mobility of the charge carriers.

In general, a variation in mass of the constituent atoms in a lattice reduces the phonon lifetime within the crystal, which in turn leads to reduced thermal conductivity. In the case of a SiGe random alloy, variation in mass between Si and Ge atoms, and among the various isotopes of Si and Ge, leads to reduced thermal conductivity. In a typical random SiGe alloy with naturally occurring Si and Ge, Si has three isotopes $^{28}$Si, $^{29}$Si and $^{30}$Si, and Ge has five isotopes $^{70}$Ge, $^{72}$Ge, $^{73}$Ge, $^{74}$Ge and $^{76}$Ge. The thermal conductivity of the SiGe material can be improved by using isotopically enriched gas sources for SiGe formation, which minimizes the isotopic mass variance of the Si and Ge respectively. U.S. Published patent application 2004/0004271 (Fukuda et al.) proposes that a SiGe layer be formed by deposition using silane (SiH$_4$) and germane (GeH$_4$) gases where the isotope concentration of $^{28}$Si and $^{70}$Ge are both greater than 95%. A layer of Si (which may also be isotopically enriched) is deposited over this SiGe layer. This technique results in a bilayer structure of strained Si on a relaxed SiGe alloy layer having reduced isotopic mass variance, on a bulk Si substrate or an SOI substrate. FIGS. 1 and 2 show application of this technique on an SOI substrate. A typical SOI substrate 10 has an insulator layer 2 and a Si layer 3 on a Si substrate 1 (FIG. 1). Source gases 21, 22 for isotopically enriched Si and Ge are used in a deposition process to form a random SiGe alloy layer 4 (FIG. 2). The isotopic enrichment serves to lower the mass variance of the SiGe layer, thereby improving its thermal conductivity.

A thermal mixing process may be employed to mix Si layer 3 with reduced-mass-variance SiGe layer 4, to produce a relaxed SiGe layer 5 on insulator 2 (FIG. 3). This structure may thus be viewed as a relaxed SiGe-on-insulator (SGOI) substrate, on which a Si layer 6 may be formed to provide a strained Si layer, as shown in FIG. 4.

In order to realize the advantages of strained Si layers in CMOS devices, there is a need to provide Si/SiGe bilayer structures with improved thermal conductivity in the SiGe alloy layer. It is desirable to form relaxed SiGe layers with reduced mass variance, without the added complexity and expense of using isotopically enriched source gases for the Si and Ge.

SUMMARY OF INVENTION

The present invention provides a method of forming a SiGe layer on a substrate, where the SiGe layer has greater thermal conductivity than that of a random alloy of SiGe. In this method, a first layer of Si or Ge is deposited on a substrate in a first depositing step; a second layer of the other element is deposited on the first layer in a second depositing step; and the first and second depositing steps are repeated so as to form a combined SiGe layer having a plurality of Si layers and a plurality of Ge layers. The respective thicknesses of the Si layers and Ge layers are in accordance with a desired composition ratio of the combined SiGe layer (so that a 1:1 ratio typically is realized with Si and Ge layers each about 10 Å thick). The combined SiGe layer is characterized as a digital alloy of Si and Ge having a thermal conductivity greater than that of a random alloy of Si and Ge. This method may further include the step of depositing a Si layer on the combined SiGe layer; the combined SiGe layer is characterized as a relaxed SiGe layer, and the Si layer is a strained Si layer. For still greater thermal conductivity in the SiGe layer, the first layer and second layer may be deposited so that each layer consists essentially of a single isotope.

According to another aspect of the invention, a method is provided for of fabricating a semiconductor device. This method includes the steps of forming a layer of a digital alloy of SiGe on a substrate, and forming a Si layer on the digital alloy of SiGe. The digital alloy of SiGe has a thermal conductivity greater than that of a random alloy of Si and Ge. The digital alloy layer may also be characterized as a relaxed SiGe layer, with the Si layer being a strained Si layer.

According to a particular embodiment of the invention, the digital alloy layer includes a plurality of alternating sublayers of Si and Ge. These sublayers are formed with thicknesses in accordance with a desired composition ratio of the digital alloy of SiGe. Each of the sublayers may consist essentially of a single isotope.

According to a further aspect of the invention, a semiconductor device is provided which includes a layer of a digital alloy of SiGe on a substrate and a Si layer on the digital alloy of SiGe, wherein the digital alloy of SiGe has a thermal conductivity greater than that of a random alloy of Si and Ge. The digital alloy layer may be characterized as a relaxed SiGe layer, and the Si layer on the SiGe layer as a strained Si layer. The digital alloy layer includes a plurality of alternating sublayers of Si and Ge. The substrate may be a bulk Si substrate, or an SOI or SGOI structure.

DETAILED DESCRIPTION

In accordance with the present invention, a layer of SiGe alloy is formed on a substrate (typically bulk Si, SOI or SGOI); the SiGe alloy layer has reduced mass variance and hence higher thermal conductivity than a layer of random SiGe alloy. This is accomplished by forming the SiGe layer as an ordered digital alloy, as opposed to a random alloy.

Figure 1:
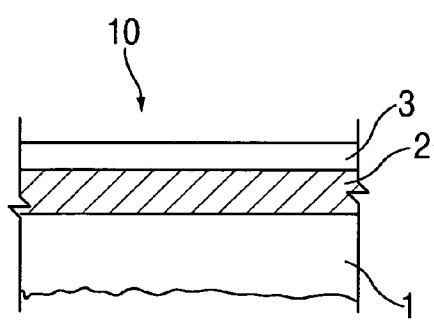
FIG. 1 is a schematic illustration of a typical SOI substrate.
Figure 2:
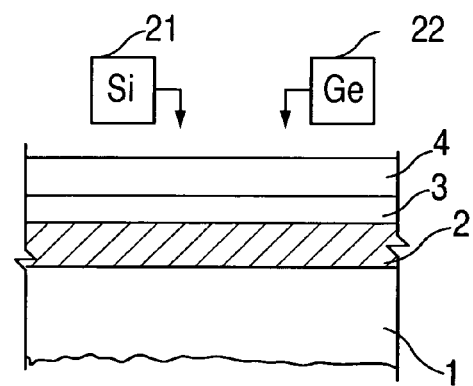
FIG. 2 illustrates a SiGe layer formation technique using isotopically enriched Si and Ge sources.
Figure 3:
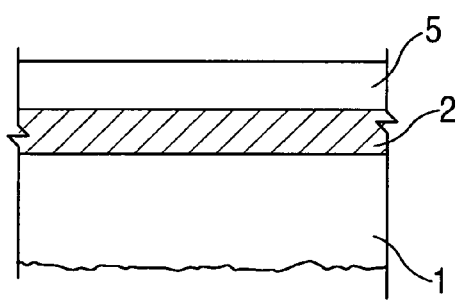
FIG. 3 is a schematic illustration of a SiGe-on-insulator (SGOI) structure formed by thermal mixing of SiGe and Si layers.
Figure 4:
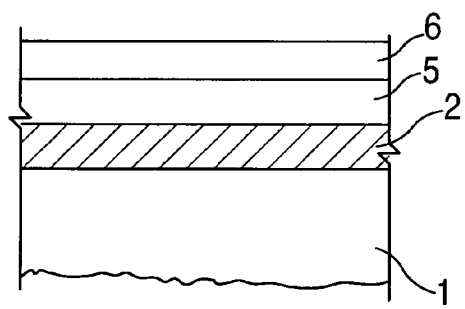
FIG. 4 illustrates a strained Si layer on a SGOI substrate.
Figure 5:
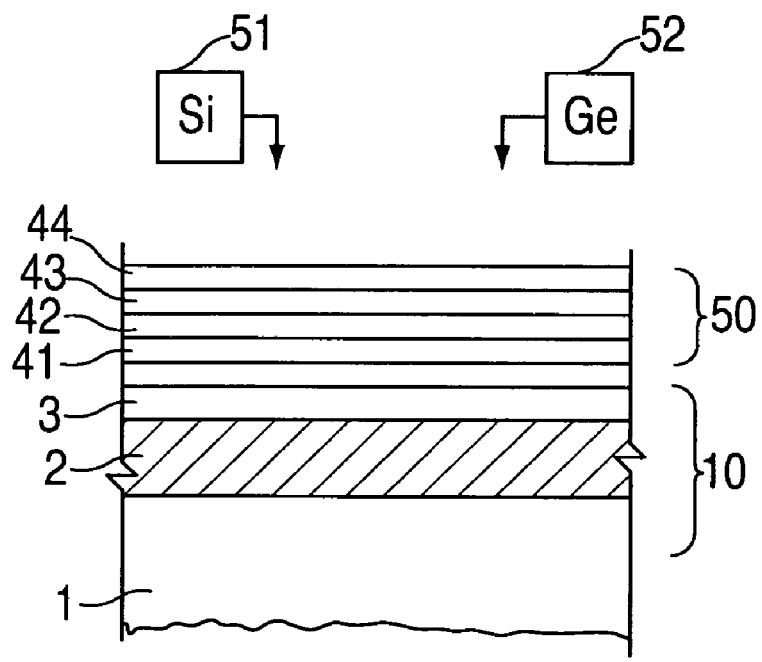
FIG. 5 is a schematic illustration of a formation process for a low-mass-variance digital SiGe alloy layer on a SOI or SGOI substrate, in accordance with the present invention.

FIG. 5 illustrates a SiGe digital alloy formed by the process of the present invention. The substrate 10 (here shown as an SOI structure with Si layer 3 and insulator 2 on bulk substrate 1) is placed in a processing chamber where layers of either Si or Ge may be deposited on the substrate using Si and Ge sources 51, 52. A variety of deposition techniques may be used, including ultrahigh-vacuum CVD (UHVCVD) and low-temperature epitaxy (LTE), preferably at temperatures less than 650° C.

A thin layer 41 of Si is deposited on the substrate, and a thin layer 42 of Ge is deposited on layer 42. Alternating layers 43, 44, etc. of Si and Ge are deposited until a desired total thickness of Si/Ge is reached. If a 1:1 composition ratio of Si/Ge is desired, each of the Si and Ge layers is typically 10 Å in thickness. The relative thickness of the Si and Ge layers is adjusted in accordance with the desired composition ratio. For example, if the overall SiGe layer is to be 90% Si, layers 41 and 43 of Si would each typically be 90 Å thick while layers 42, 44 of Ge would each typically be 10 Å thick. The total number of Si and Ge layers depends on the desired thickness of the combined layer 50, which may vary from a few hundred Å to as much as a micron, depending on the device application. For example, if the SiGe layer is to be 50% Si and 500 Å thick, there would typically be 50 sublayers of Si and Ge (25 of each) 10 Å thick.

It is also desirable to limit the effect of mass variance in the substrate layer 3 (for example, if the substrate is SGOI so that layer 3 is itself a SiGe layer). This may be done before deposition of the Si/Ge sublayers 41, 42, etc. by thinning layer 3 (e.g. by polishing) so that the thickness of layer 3 is only a small fraction of layer 50. In the example given above where layer 50 is 500 Å thick and includes 25 sublayers each of Si and Ge, layer 3 may be thinned to 50 Å.

The combined layer 50, including all the alternating sublayers of Si and Ge, may be viewed as a superlattice, and more particularly as an ordered alloy or digital alloy of SiGe.

It should be noted that, since each sublayer has only one element present, the mass variance in the combined layer is less than in a random alloy layer. Accordingly, the thermal conductivity of Si/Ge combined layer 50 is greater than for a conventionally deposited SiGe layer.

In this embodiment, the upper layer 3 of the substrate is a Si layer in an SOI structure, and the first-deposited sublayer 41 is also Si. As is understood in the art, this arrangement provides the advantages of a homoepitaxial interface between the substrate and the deposited layer; specifically, silicon growth tends to reduce the amount of oxygen at the growth interface, leading to a higher quality crystal layer.

Alternatively, the first-deposited sublayer may be of Ge if desired. As noted above, Si/Ge layer 50 may also be formed on a bulk Si or SGOI substrate.

Figure 6:
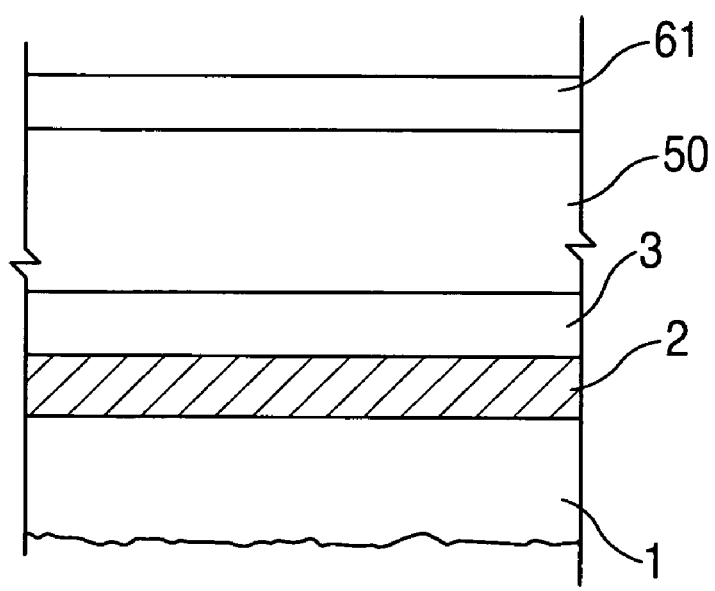
FIG. 6 illustrates a strained Si layer deposited on the SiGe alloy layer of FIG. 5.

Each of the sublayers 42, 43, 44, etc. will have stress due to mismatch with the sublayer immediately below. However, the combined layer 50 as a whole has effectively zero stress, and for the purpose of forming a strained Si layer functions as a relaxed SiGe layer. A layer of Si 61 deposited on layer 50 will thus be a strained Si layer (see FIG. 6), and the Si/SiGe combination 61, 50 will have higher thermal conductivity than a Si/SiGe bilayer where the SiGe is a random alloy.

In this embodiment, the Si and Ge delivered by sources 51, 52 (e.g. $SiH_4$ and $GeH_4$ gases respectively) are not isotopically enriched. However, isotope-enriched sources may be used to achieve very low mass variance in the individual Si and Ge sublayers, and accordingly further improve the thermal conductivity of Si/Ge layer 50.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

We claim:

1. A method of forming a SiGe layer on a substrate, the method comprising the steps of:

depositing a first layer of one of Si and Ge in a first depositing step on said substrate;

depositing a second layer of the other of Si and Ge on the first layer in a second depositing step; and repeating said first depositing step and said second depositing step so as to form a combined SiGe layer having a plurality of Si layers and a plurality of Ge layers, wherein respective thicknesses of the Si layers and Ge layers are in accordance with a desired composition ratio of the combined SiGe layer; the substrate is a SiGe-on-insulator (SGOI) structure; and the combined SiGe layer is characterized as a digital alloy of Si and Ge having a thermal conductivity greater than that of a random alloy of Si and Ge.

2. A method according to claim 1, wherein one or more of the Ge layers has a thickness of about 10 Å.

3. A method according to claim 1, further comprising the step of depositing a Si layer on the combined SiGe layer, wherein the combined SiGe layer is further characterized as a relaxed SiGe layer, and said Si layer is a strained Si layer.

4. A method according to claim 1, wherein the substrate has an upper layer, further comprising the step of polishing said upper layer to reduce the thickness thereof, before said first depositing step.

5. A method according to claim 1, wherein at least one of the first layer and the second layer consists essentially of a single isotope.

6. A method of fabricating a semiconductor device, comprising the steps of:

forming a layer of a digital alloy of SiGe on a substrate; and forming a Si layer on the digital alloy of SiGe, wherein the substrate is a SiGe-on-insulator (SGOI) structure, and the digital alloy of SiGe has a thermal conductivity greater than that of a random alloy of Si and Ge.

7. A method according to claim 6, wherein the digital alloy layer is characterized as a relaxed SiGe layer, and said Si layer is a strained Si layer.

8. A method according to claim 6, wherein the digital alloy layer comprises a plurality of alternating sublayers of Si and Ge.

9. A method according to claim 8, wherein the sublayers are formed with thicknesses in accordance with a desired composition ratio of the digital alloy of SiGe.

10. A method according to claim 8, wherein one or more of the sublayers consists essentially of a single isotope.

11. A semiconductor device comprising:
a layer of a digital alloy of SiGe on a substrate; and
a Si layer on the digital alloy of SiGe,
wherein the substrate is a SiGe-on-insulator (SGOI) structure, and the digital alloy of SiGe has a thermal conductivity greater than that of a random alloy of Si and Ge.

12. A device according to claim 11, wherein the digital alloy layer is characterized as a relaxed SiGe layer, and said Si layer is a strained Si layer.

13. A device according to claim 11, wherein the digital alloy layer comprises a plurality of alternating sublayers of Si and Ge.

14. A device according to claim 13, wherein the sublayers are formed with thicknesses in accordance with a desired composition ratio of the digital alloy of SiGe.

15. A device according to claim 13, wherein one or more of the sublayers consists essentially of a single isotope.

16. A device according to claim 13, wherein one or more of the Ge layers has a thickness of about 10 Å.

17. A device according to claim 13, wherein a sublayer of Si is disposed on the substrate.

* * * * *